(12) United States Patent
Chang et al.

(10) Patent No.: US 9,018,090 B2
(45) Date of Patent: Apr. 28, 2015

(54) BORDERLESS SELF-ALIGNED METAL CONTACT PATTERNING USING PRINTABLE DIELECTRIC MATERIALS

(75) Inventors: Josephine B. Chang, Mahopac, NY (US); Sebastian U. Engelmann, White Plains, NY (US); Nicholas C. M. Fuller, North Hills, NY (US); Michael A. Guillorn, Yorktown Heights, NY (US); Eric A. Joseph, White Plains, NY (US); Adam M. Pyzyna, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 13/270,047

(22) Filed: Oct. 10, 2011

(65) Prior Publication Data
US 2013/0087860 A1  Apr. 11, 2013

(51) Int. Cl.
*H01L 21/4763* (2006.01)
*H01L 21/768* (2006.01)
*H01L 21/8234* (2006.01)

(52) U.S. Cl.
CPC ... *H01L 21/76897* (2013.01); *H01L 21/823425* (2013.01); *H01L 21/823475* (2013.01)

(58) Field of Classification Search
CPC ............... H01L 21/76897; H01L 21/823425; H01L 21/823475; H01L 2924/00; H01L 27/14689; H01L 29/6656; H01L 29/66628; H01L 29/66795; H01L 21/28114; H01L 21/76831; H01L 21/76837; H01L 21/823842; H01L 27/10844; H01L 29/665

USPC ............ 257/369, E21.159, E27.062; 438/618
See application file for complete search history.

(56) References Cited

U.S. PATENT DOCUMENTS

| | | | |
|---|---|---|---|
| 5,998,252 A | 12/1999 | Huang | 438/241 |
| 6,033,980 A * | 3/2000 | Liou et al. | 438/624 |
| 6,214,662 B1 * | 4/2001 | Sung et al. | 438/241 |
| 7,163,881 B1 * | 1/2007 | Chen et al. | 438/595 |
| 7,329,912 B2 | 2/2008 | Yaung | 257/236 |
| 7,541,216 B2 * | 6/2009 | Yates et al. | 438/99 |
| 7,582,567 B1 | 9/2009 | Syau et al. | 438/706 |
| 7,611,941 B1 * | 11/2009 | Shum et al. | 438/201 |
| 2005/0140002 A1 * | 6/2005 | Shin et al. | 257/734 |
| 2005/0269605 A1 * | 12/2005 | Yaung | 257/291 |
| 2009/0302372 A1 | 12/2009 | Chang et al. | 257/327 |
| 2010/0038715 A1 | 2/2010 | Babich et al. | 257/347 |
| 2010/0038723 A1 | 2/2010 | Babich et al. | 257/384 |
| 2010/0072523 A1 * | 3/2010 | Sato et al. | 257/289 |

OTHER PUBLICATIONS

U.S. Appl. No. 12/755,752.

(Continued)

*Primary Examiner* — Duy T Nguyen
(74) *Attorney, Agent, or Firm* — Ido Tuchman; Vazken Alexanian

(57) ABSTRACT

Borderless self-aligned metal contacts to high density complementary metal oxide semiconductor (CMOS) circuits and methods for constructing the same. An example method includes creating an enclosed region for metal deposition defined by the gates of the adjacent transistors and an opposing pair of dielectric walls adjacent to source regions and drain regions of the adjacent transistors. The method further includes depositing a metal layer within the enclosed region. The metal contacts thus formed are self-aligned to the enclosed regions.

7 Claims, 4 Drawing Sheets

(56) References Cited

OTHER PUBLICATIONS

I.-B. Baek et al., "Electron beam lithography patterning of sub-10 nm line using hydrogen silsesquioxane for nanoscale device applications," J. Vac. Sci. Technol. B, vol. 23, 2005, pp. 3120-3123.

M. Guillorn et al., "Hydrogen silsesquioxane-based hybrid electron beam and optical lithography for high density circuit prototyping," J. Vac. Sci. Technol. B vol. 27, 2009, pp. 2588-2592.

M. Wei et al., "A Scalable Self-Aligned Contact NOR Flash Technology," IEEE Symposium on VLSI Technology, Jun. 12-14, 2007, pp. 226-227.

* cited by examiner

BORDERLESS SELF-ALIGNED METAL CONTACT PATTERNING USING PRINTABLE DIELECTRIC MATERIALS

BACKGROUND

The present invention relates to semiconductor manufacturing, and, more particularly, to CMOS circuits having borderless self-aligned metal contacts and methods for forming such circuits.

Metal contacts to complementary metal oxide semiconductors (CMOS) circuits are formed after the completion of the front end of line (FEOL) process modules. The devices are typically encapsulated in one or more dielectric materials and the surface of the substrate is planarized. A single or a combination of lithographic operations are performed to expose contact vias aligned to the source, drain and gate regions of the device. One or more reactive ion etching (RIE) processes are performed to remove the dielectric materials from the lithographically patterned regions. Upon completion of the etch process, the contact vias are filled with a suitable metallization for forming an ohmic contact to the underlying device structure.

As the gate pitch of a CMOS circuit decreases, the size and pitch of metal contacts must scale accordingly. Consequently, the alignment tolerance for the metal contacts with respect to the gate electrodes becomes more critical. Gross misalignment of the metal contacts may result in gate-to-source and gate-to-drain shorts, rendering the underlying devices inoperable. As the gate pitch shrinks below 80 nm in modern semiconductor devices, the incorporation of the gate electrodes, sidewall spacers and the metal contacts themselves shrinks the overlay tolerance to a point where the formation of metal contacts becomes a bottleneck for continued technology scaling.

BRIEF SUMMARY

An example embodiment of the present invention is a method for aligning a metal contact between gates of adjacent transistors. The method includes creating an enclosed region for metal deposition defined by a gate electrode encapsulated by a dielectric sidewall (SW) spacer and dielectric hardmask and an opposing pair of dielectric walls adjacent to source regions and drain regions of the adjacent transistors. The method further includes depositing a metal layer within the enclosed region.

Yet another example embodiment of the invention is an array of complementary metal oxide semiconductor field effect transistors (CMOSFET). The array of CMOSFETs includes a plurality of source regions, drain regions and gate electrodes. The array of CMOSFETs also includes a plurality of dielectric sidewall spacers along sidewalls of the gate electrodes. The array of CMOSFETs further includes a plurality of metal contacts disposed over the source regions and the drain regions. The dielectric sidewall spacers of the adjacent gate electrodes partially define the boundaries of the metal contacts.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to Figures.

Figure 2:
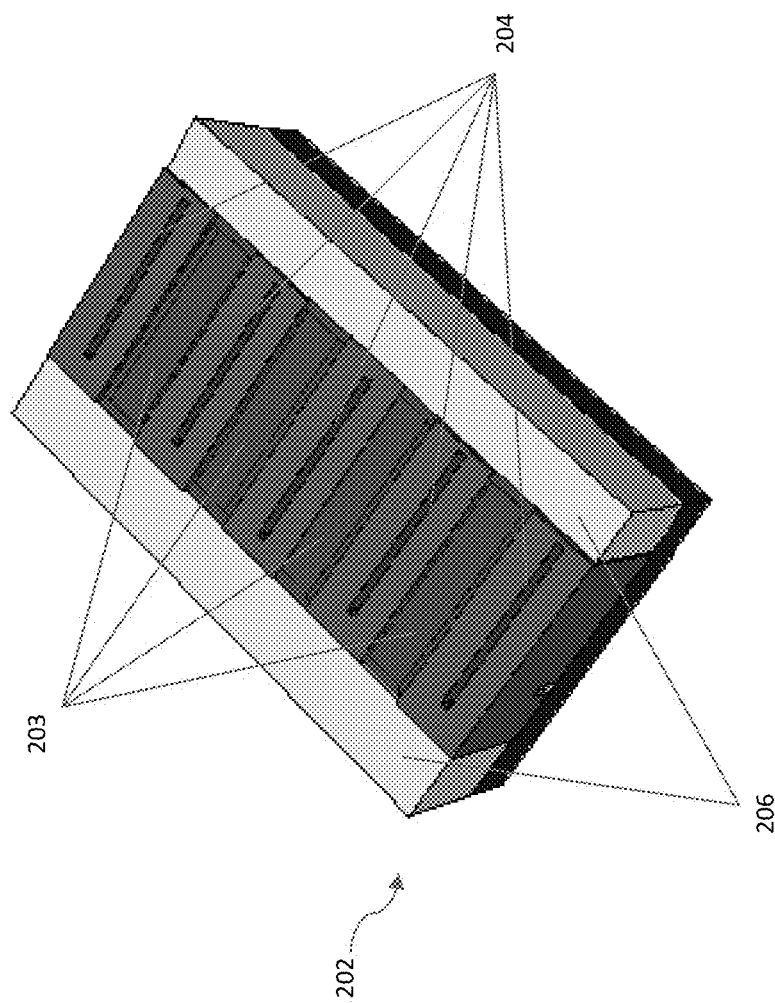
FIG. 2 shows an example array of complementary metal oxide semiconductor field effect transistors (CMOSFET) contemplated by the present invention.

With reference to FIG. 2, embodiments of the present invention include self-aligned metal contracts 204 between gates 203 of adjacent transistors in a transistor array 202. As discussed in more detail below, lithography is used to directly pattern a Si-containing dielectric material also referred to herein as a printable dielectric or a patternable dielectric.

Figure 1:
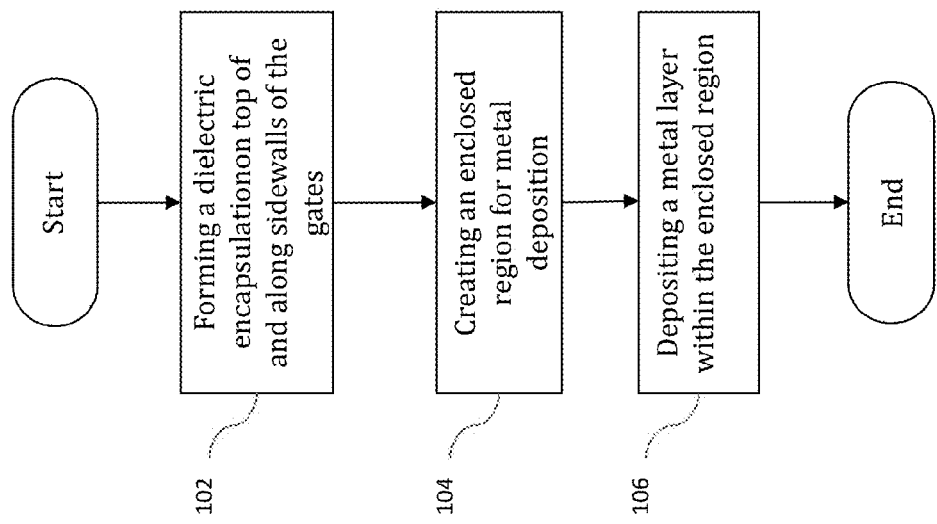
FIG. 1 shows an example method for aligning a metal contact between gates of adjacent transistors contemplated by the present invention.

FIG. 1 is a flowchart for a method of aligning a metal contact between gates of adjacent transistors in accordance with an embodiment of the present invention. The method starts at a depositing step 102. During this operation, a dielectric mask is deposited on top of and along sidewalls of the transistor gates. Suitable materials for the dielectric mask include $SiO_2$, SiN, BN and $HFO_2$.

In one embodiment, the thickness of the dielectric mask on top of the gates is greater than 5 nm such that the dielectric mask will retain its integrity throughout subsequent pattern transfer process. In yet another embodiment, the thickness of the dielectric mask along the sidewalls of the gates is greater than 5 nm such that the dielectric mask will prevent field induced dielectric breakdown between the gates and the metal contacts. After the depositing step 102 is completed, the process continues to creating step 104.

During creating step 104, an enclosed region for metal deposition is created. The enclosed region is defined by the gates of the adjacent transistors and an opposing pair of dielectric walls adjacent to source regions and drain regions of the adjacent transistors. In one embodiment, the height of the opposing pair of dielectric walls that partially defines the enclosed region is equivalent to the height of the gate with the dielectric mask deposited on top of the gate resulting from the depositing step 102.

In yet another embodiment, the opposing pair of dielectric walls may include a printable dielectric resistant to reactive ion etch (RIE) chemistry process for metallization etch back. For example, the dielectric walls may include methyl silsesquioxane (MSQ) based resists for 248 and 193 nm photolithography and hydrogen silsesquioxane (HSQ) based resists for electron beam lithography (EBL) and extreme ultraviolet (EUV) lithography.

After the creating step 104 is completed, the process continues to metallization step 106. During the metallization step 106, a metal layer is deposited within the enclosed region. In this manner, a metal contact is formed in the enclosed region defined by the gates of the adjacent transistors and the opposing pair of dielectric walls adjacent to the source regions and the drain regions of the adjacent transistors. To form a metal contact in the enclosed region, an anisotropic process may be applied.

In one embodiment of the method, lithography is used to directly pattern a Si-containing dielectric material, also referred to herein as printable dielectric or patternable dielectric. In this embodiment, the Si-containing dielectric can be patterned and developed like a resist and does not require the use of an additional resist material or etching process. The lithography process results in the formation of an opposing pair of dielectric walls adjacent to source regions and drain regions of the adjacent transistors. Thus, an enclosed region is formed defined by the opposing pair of dielectric walls adjacent to source regions and drain regions of the adjacent transistors and by the dielectric masks along the sidewalls of the gates. The enclosed region enables the metal contact to self-align to the adjacent gates during a deposition and etch back process.

In the embodiment discussed above, the lithographic formation of the enclosed region uses a non-damaging process, unlike the removal of dielectrics by reactive ion etch (RIE). This facilitates the integration of metal contacts with sensitive substrate materials including ultra-thin silicides, unsilicided semiconductor materials and materials that are not generally compatible with RIE, such as carbon nanotubes. Thus, the lithography operation has a relaxed overlay tolerance compared to the printing of a metal contact via in a traditional metal contact formation process because the metal contact is self-aligned to the dielectric masks along the sidewalls of the gates.

Figure 3:
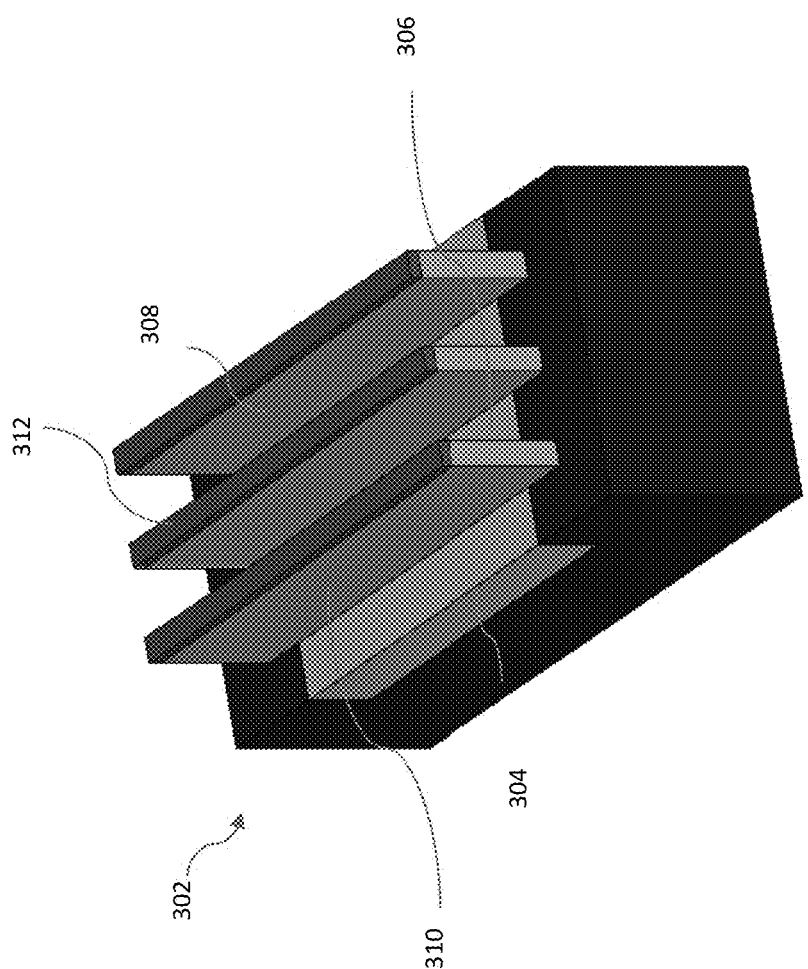
FIG. 3 shows an example single CMOSFET contemplated by the present invention.
Figure 4B:
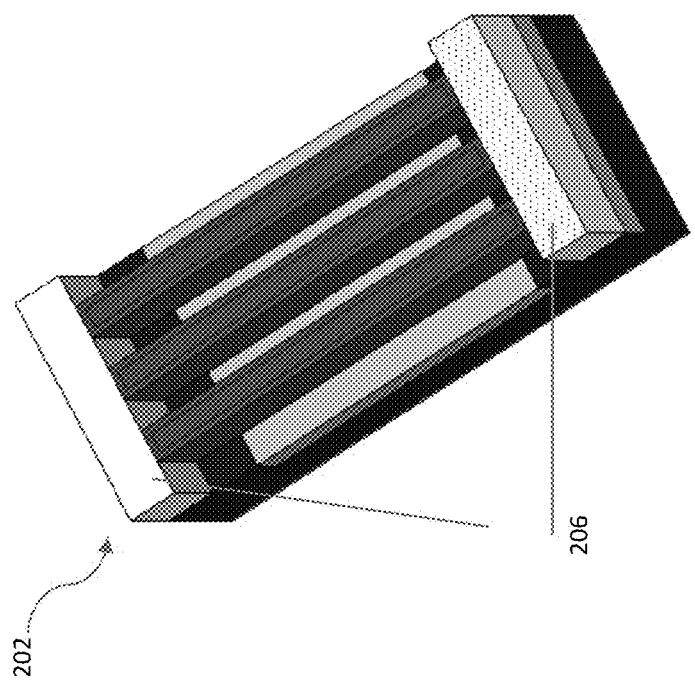
FIG. 4B shows an example array of CMOSFETs contemplated by the present invention after an opposing pair of dielectric walls is constructed.
Figure 4A:
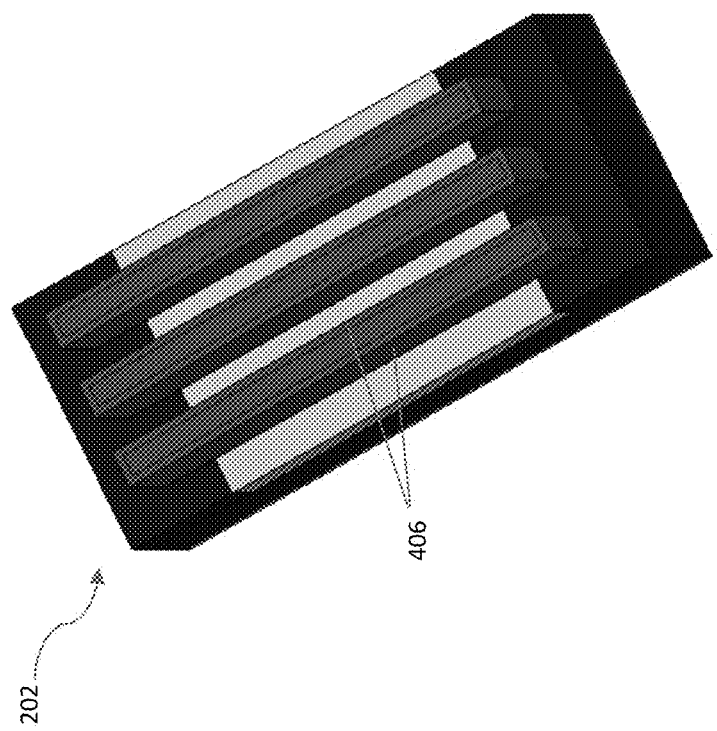
FIG. 4A shows an example array of CMOSFETs contemplated by the present invention before an opposing pair of dielectric walls is constructed.

FIG. 2 shows an isometric view of an example array of complementary metal oxide semiconductors field effect transistors (CMOSFETs) 202 contemplated by the present invention. To further illustrate this embodiment, FIG. 3 shows a single CMOSFET 302 containing a source region 304, a drain region 306 and a gate region 308. FIG. 4A shows the array of CMOSFETs 202 before an opposing pair of dielectric walls 206 is constructed. FIG. 4B shows the array of CMOSFETs 202 after the opposing pair of dielectric walls 206 is constructed.

Turning to FIG. 3, the array of CMOSFETs includes a plurality of source regions 304, drain regions 306, and gate electrodes 310. As shown in FIGS. 4A and 4B, the array of CMOSFETs 202 further includes a plurality of dielectric sidewalls spacers 406 along the sidewalls of the gate electrodes 310. Suitable materials for the dielectric sidewall spacers 406 include $SiO_2$, SiN, BN and $HFO_2$. To prevent high field induced dielectric breakdown between the gate electrodes 310 and metal contacts 204, the thickness of the dielectric sidewall spacers 406 is preferably greater than 5 nm but is dependent on the operating voltages of the transistor. A sufficient thickness must be chosen to avoid a breakdown of the dielectric material occasioned by the field created by the contact and the gate.

The array of CMOFETs 202 further includes a plurality of metal contacts 204 disposed over the source regions 304 and the drain regions 306. The boundaries of the metal contacts 204 are defined in part by the dielectric sidewall spacers 406 of the adjacent gate electrodes 310.

The array of CMOSFETs 202 further includes a plurality of gate hard masks 312 on top of the plurality of gate electrodes 310. Suitable materials for the gate hard masks 312 include $SiO_2$, SiN, BN and $HFO_2$. To retain their integrity throughout subsequent pattern transfer process, the thickness of the gate hard masks 312 is preferably greater than 5 nm. A sufficient thickness must be chosen to avoid a breakdown of the dielectric material occasioned by the field created by the contact and the gate.

The array of CMOSFETs 202 further includes an opposing pair of dielectric walls 206 adjacent to the source regions 304 and the drain regions 306. The opposing pair of dielectric walls 206 further defines the boundaries of the plurality of metal contacts 204. The opposing pair of dielectric walls 206 is made of a printable dielectric. To be resistant to reactive ion etching (RIE) chemistry used for metallization etch back, suitable materials for the dielectric walls 206 include methyl silsesquioxane (MSQ) based resists for 248 and 193 nm photolithography, and hydrogen silsesquioxane (HSQ) based resists for electron beam lithography (EBL) and extreme ultraviolet (EUV) lithography. In one embodiment, the thickness of the opposing pair of dielectric walls 206 adjacent to the source regions 304 and the drain regions 306 is chosen to be equivalent to the height of the gate electrode 310 with the gate hard mask 312.

It is contemplated that a software tool can automatically convert design data to the pattern data required to print the boundary regions. The software tool may generate mask data for circuits employing the present invention from design data by taking the boundary of the pattern and subtracting the gate and contact patterns. This pattern can be decomposed into separate composite images to facilitate printing and enhance pattern fidelity as is typically done for double exposure printing processes.

The software tool may also automatically convert design data to data for efficient electron beam lithography (EBL) direct write patterning. It is noted that direct write EBL tools cannot pattern large areas efficiently. A more efficient algorithm for preparing exposure data for these systems involves increasing the size of the existing contact shape by two to three times the gate pitch and then subtracting the gate and contact pattern from this intermediate pattern.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method for aligning a metal contact between gates of adjacent transistors, the method comprising:
   creating an enclosed region for metal deposition defined by the gates of the adjacent transistors and an opposing pair of dielectric walls adjacent to source regions and drain regions of the adjacent transistors, wherein each of the opposing pair of dielectric walls is in contact with at least two of the gates;
   forming a dielectric mask on top of and along sidewalls of the gates prior to creating the enclosed region and prior to creating the opposing pair of dielectric walls, wherein the height of the opposing pair of dielectric walls is the same as the height of the gate with the deposited dielectric mask; and
   depositing a metal layer within the enclosed region, the metal layer is self-aligned to the dielectric mask along sidewalls of the gates; and
   wherein the opposing pair of dielectric walls includes a printable dielectric resistant to a reactive ion etch (RIE) chemistry process for a metallization etch back.

2. The method of claim 1, wherein the dielectric mask is one of $SiO_2$, SiN, BN and $HFO_2$.

3. The method of claim 1, wherein the thickness of the dielectric mask on top of the sidewalls of the gates is greater than 5 nm such that the dielectric mask retains its integrity throughout subsequent pattern transfer process.

4. The method of claim 1, wherein the thickness of the dielectric mask along the sidewalls of the gates is greater than 5 nm such that the dielectric mask prevents field induced dielectric breakdown between the gates and the metal contact.

5. The method of claim 1, wherein the opposing pair of dielectric walls includes methyl silsesquioxane (MSQ) based resists for 248 and 193 nm photolithography and hydrogen silsesquioxane (HSQ) based resists for electron beam lithography (EBL) and extreme ultraviolet (EUV) lithography.

6. The method of claim 1, wherein depositing the metal layer includes forming a metal contact in the enclosed region defined by the gates of the adjacent transistors and the opposing pair of dielectric walls adjacent to the source regions and the drain regions of the adjacent transistors.

7. The method of claim 6, wherein the metal contact is formed by an anisotropic process.

* * * * *